(12) United States Patent
Hattis

(10) Patent No.: US 7,817,434 B2
(45) Date of Patent: Oct. 19, 2010

(54) METHOD AND APPARATUS FOR IMPROVING THERMAL ENERGY DISSIPATION IN A DIRECT-CHIP-ATTACH COUPLING CONFIGURATION OF AN INTEGRATED CIRCUIT AND A CIRCUIT BOARD

(75) Inventor: James M. Hattis, Saint Louis Park, MN (US)

(73) Assignee: Agere Systems Inc., Allentown, PA (US)

( * ) Notice: Subject to any disclaimer, the term of this patent is extended or adjusted under 35 U.S.C. 154(b) by 1223 days.

(21) Appl. No.: 11/403,492

(22) Filed: Apr. 13, 2006

(65) Prior Publication Data

US 2006/0211461 A1 Sep. 21, 2006

Related U.S. Application Data

(63) Continuation-in-part of application No. PCT/US2004/033982, filed on Oct. 14, 2004.

(51) Int. Cl.
*H05K 1/00* (2006.01)
(52) U.S. Cl. ...................................... 361/748
(58) Field of Classification Search ................. 361/784, 361/748, 600, 679.01; 174/164, 250
See application file for complete search history.

(56) References Cited

U.S. PATENT DOCUMENTS

| 5,262,922 | A | 11/1993 | Yamaji et al. |
| 5,812,375 | A | 9/1998 | Casperson et al. |
| 5,896,271 | A * | 4/1999 | Jensen et al. ................. 361/719 |
| 5,920,458 | A * | 7/1999 | Azar ........................... 361/704 |
| 6,337,228 | B1 | 1/2002 | Juskey et al. |
| 7,245,507 | B2 * | 7/2007 | DiBene et al. .............. 361/803 |
| 7,361,844 | B2 * | 4/2008 | Vinciarelli et al. .......... 174/260 |
| 7,552,530 | B2 * | 6/2009 | Mueller ....................... 29/832 |
| 7,573,717 | B2 * | 8/2009 | Reis et al. .................... 361/719 |
| 7,593,235 | B2 * | 9/2009 | Espino ....................... 361/760 |
| 2001/0028110 | A1 | 10/2001 | Andoh |
| 2005/0245060 | A1 * | 11/2005 | Chiu ........................... 438/612 |
| 2005/0285246 | A1 | 12/2005 | Haba et al. |

FOREIGN PATENT DOCUMENTS

| EP | 0 080 156 A | 6/1983 |
| EP | 0 981 268 A1 | 2/2000 |
| EP | 1 261 028 A2 | 11/2002 |

\* cited by examiner

*Primary Examiner*—Jinhee J Lee
*Assistant Examiner*—Abiy Getachew
(74) *Attorney, Agent, or Firm*—Daniel J. Santos; John M. Harman

(57) ABSTRACT

A method and apparatus for improving the thermal conductivity of a circuit board (CB) assembly comprising an integrated circuit (IC) die mounted on a CB. A high thermal conductivity device is attached on a first end to a surface of the die. When the die is mounted on the CB, a void formed in the CB receives a second end of the HTC device, and the second end of the HTC device comes into contact with a portion of the CB. During operation of the die, heat produced by the die is dissipated through the HTC device and into the CB.

14 Claims, 3 Drawing Sheets

METHOD AND APPARATUS FOR IMPROVING THERMAL ENERGY DISSIPATION IN A DIRECT-CHIP-ATTACH COUPLING CONFIGURATION OF AN INTEGRATED CIRCUIT AND A CIRCUIT BOARD

CROSS-REFERENCE TO RELATED APPLICATIONS

This application is a continuation-in-part application of PCT application No. PCT/US04/33982, filed on Oct. 14, 2004.

TECHNICAL FIELD OF THE INVENTION

The present invention relates to circuit boards (CBs), and more particularly, to dissipating thermal energy generated by an integrated circuit (IC) mounted on a CB.

BACKGROUND OF THE INVENTION

Typical IC packages usually include an enclosed and/or encapsulated plastic housing with an internal lead frame, bond wires and die, as well as external electrical leads for electrically connecting the die to the outside world. IC packages that house higher thermal dissipation die have an additional integral heat sink formed within the package that is connected to the IC substrate. The heat sink typically comprises a metal layer. A die is usually mounted on this metal layer with its electrical contact pads face up and bond wires connecting the electrical contact pads of the die to the internal lead frame of the IC package. The lead frame provides a mechanically rigid electrical path from the die and the bond wires to the external electrical leads of the IC package. The lead frame is usually molded partially within the plastic housing in order to bridge the electrical connection between the internal lead frame and the external leads. The electrical leads make the electrical connection from the package to a circuit board (CB) on which the package is mounted.

When a high-power thermal dissipation IC is mounted on a CB, a heat spreader device on the CB located directly underneath the IC package is thermally connected to the heat sink of the IC package and then to a ground plane within the layers of the CB, which is typically a printed circuit board (PCB) layers. The heat spreader device dissipates heat generated by the IC into the CB ground plane itself. Heat generated by the IC is also convectively moved away from the IC package out to the surrounding air. However, when the use of the IC package is constrained to a small physical location and/or is physically small relative to other die, there is usually very poor circulation of air around the package, and thus very little removal of heat by convection. All of the heat generated by the IC must then be mostly dissipated in a direction down through the IC package heat sink and into the heat spreader device of the CB.

In direct-chip-attach configurations, the IC package is eliminated and the die is mounted directly to the CB in an inverted position such that the electrical contact pads on the die face downward toward the confronting circuit traces on the CB, and are electrically connected by electrical interconnects (e.g., solder bumps) that connect the contact pads of the die to the circuit traces on the CB. The CB used in a direct-chip-attach configuration is usually a physically flexible PCB and is known as a flex CB or flex circuit. Because of its flexibility, the flex CB can be shaped into a small physical area, while still maintaining the electrical contact between the CB and the die. These types of circuits are often used in situations where very little space is available to mount the CB, such as on a read/write head that reads data from and writes data to a hard drive magnetic recording media within a hard disc drive (HDD). These read/write heads typically sit on a stainless steel armature with the flex CB mounted upon it. The electrical contacts of the flex CB typically connect the read/write heads to electrical contacts of a read/write preamplifier IC. This entire assembly is then floated aerodynamically above the magnetic recording media.

FIG. 1 illustrates a perspective view of a typical direct-chip-attach assembly 11, which includes a flex CB comprising various layers 12 and an IC die 13 mounted on the flex CB 12. The IC die 13 is mounted to the flex CB 12 in a confronting position such that electrical contact pads (not shown) on the die 13 are disposed to be easily connected by electrical interconnects (e.g., solder bumps) 19 to the circuit traces (not shown) on the flex CB 12. The flex CB 12 may include a heat sink material 14 that is in contact with the side of the CB 12 that is opposite the die 13, a layer 15 of adhesive and thermally insulating dielectric material (e.g., polyimid) disposed on the heat sink material 14, a metal layer 16 disposed on layer 15, and a layer 17 of thermally insulating dielectric material (e.g., polyimid) disposed on the metal layer 16. The aforementioned circuit traces are formed by portions of the metal layer 16 of the flex CB 12, which is typically made of copper. The heat sink material 14 functions as the heat dissipator and the thermal path is in the direction from the die 13 to the heat sink material 14, as indicated by the arrows 23 and 24 directed from the die 13 into the heat sink material 14.

In some cases, flex CBs include a stabilizing device, such as an aluminum stiffener (not shown), that is located between the heat sink material 14 and the layer of polyimid and adhesive 15. The stiffener provides mechanical stability to the flex CB. In flex CBs, the stiffener may function as both a heat sink and as a stabilizing device, in which case the heat sink material 14 may be omitted. The heat sink material 14 need not be part of the CB 12, but may instead be a separate device upon which the CB 12 is placed. If a stiffener is used, it provides a path of heat dissipation into the heat sink material 14 and ultimately into the armature and housing of the disc drive.

Typically, the electrical interconnects 19 that connect the contact pads of the die 13 with the circuit traces formed in the metal layer 16 are solder or lead-free bumps that are placed on the electrical contact pads (not shown) located on the bottom face of the die 13 and heated and then placed in contact with the circuit traces on the flex CB 12. When the bumps cool and harden, they form a rigid electrical connection between the pads on the bottom face of the die 13 and the circuit traces formed in the metal layer 16 of the flex CB 12.

Once the electrical connections have been made between the pads on the die 13 and the circuit traces of the flex CB 12, a slight separation exists between the surface of the die 13 and the surface of the CB 12. Due to the physical geometry of this spacing, which is typically in the range of 25 to 76 micrometers (0.001 to 0.003 inches), the spacing between the die 13 and the flex CB 12 typically is filled with an underfill material 21 that provides mechanical stability. This is intended to prevent undue mechanical stresses from being exerted upon the die 13 and the interconnects that could cause the electrical connections to fail. The underfill material 21 is usually applied after the pads of the die 13 have been interconnected with the circuit traces on the flex CB 12. The underfill material 21 is typically applied using capillary flow. The underfill material 21 is then heated in order to cure the material into a solid, physical state. The underfill material 21 that is currently used for this purpose has poor thermal conductivity and is typically Hysol®FP4549, manufactured by the Henkel Loctite Corporation of Dusseldorf, Germany. This particular underfill material is a high purity, low stress, liquid epoxy designed for enahanced adhesion to integrated circuit passivation materials.

When a flex CB assembly such as that shown in FIG. 1 is used on a read/write head of a disc drive, the flex CB assembly normally uses large amounts of current and/or voltage to enable the read and write operations to be performed. These types of signals typically exhibit very fast rise times, some less than 200 picoseconds (ps), and large slew rates in excess of 700 miliamperes (mA) per nanosecond (ns), which produce extremely large instantaneous currents and/or voltages. These large instantaneous currents and/or voltages produce a large amount of thermal energy that needs to be dissipated.

Several attempts have been made to improve the effectiveness of the heat sink of the CB assemblies, including increasing the copper trace area on the flex circuit, increasing the copper trace thickness on the flex circuit, using higher density thermal conductivity interconnects such as dedicated locations of multiple "dummy" bumps, using higher thermal conductivity underfill, and adding heat sinks to the side of the flip-chip opposite the CB to help improve convective cooling into the surrounding air in addition to the conductive cooling already occurring through the physical structure of the die/CB interface. To date, none of these techniques, used either individually or together, have proven completely effective at significantly reducing the thermal resistance while also providing an effective low cost (or free) solution.

When a flex CB assembly is used in a very physically small environment, such as on a read/write head of a disk drive, for example, where space and cost constraints are at a premium, typical approaches for reducing thermal resistance are inadequate and/or impractical. In addition, flex CB assemblies typically use a single-layer (i.e., the metal layer 16 having traces formed in it). In cases where it is possible and practical to use a multi-layer CB, such as where space and cost constraints are not an issue, simple multi-layer plated through-hole technology can be used to provide thermally conductive heat paths down through the CB in order to dissipate thermal heat generated. However, multi-layer CBs usually cost considerably more than single-layer CBs. Therefore, using a multi-layer conductor CB may be cost prohibitive in some cases. Also, due to the aerodynamics of the head armature in a disc drive application, multi-layer CBs located on the armature of a disc drive are usually unsuitable because the additional mass on the armature can result in slower read and write speeds.

Accordingly, a need exists for a method and apparatus for more effectively dissipating thermal energy in CB assembly, particularly in a direct-chip-attach assembly.

SUMMARY OF THE INVENTION

The invention provides a method and an apparatus for dissipating heat in a circuit board assembly. The CB assembly includes a CB having a void formed in it, an integrated circuit (IC) die mounted to a side of the CB, and a high thermal conductivity (HTC) device thermally coupled on a first end to the die and at least partially disposed in the void. The HTC device has a second end that is thermally coupled to a portion of the CB below the void. Heat produced by the die is dissipated through the HTC device into the CB.

The method comprises providing a die having one or more electrical circuits and one or more electrical connections formed thereon, providing a CB having one or more electrical connections and a void formed therein, and mounting the die on a CB such that at least one electrical connection on the die is in contact with at least one electrical connection on the CB. When the die is mounted on the CB, at least a portion of the HI° C device is within the void, the first end of the HTC device is thermally coupled to the die, and the second end of the HTC device is thermally coupled with a portion of the CB.

These and other features and advantages of the present invention will become apparent from the following description, drawings and claims.

DETAILED DESCRIPTION OF THE PREFERRED EMBODIMENT

In accordance with one embodiment of the invention, a device of relatively high thermal conductivity is disposed between a die and a CB and is in contact with the die and the CB. In accordance with this embodiment, the high thermal conductivity (HTC) device is attached on one end to the die. When the die is mounted on the CB, the HTC device is partially disposed within a void formed in the CB and an end of the device opposite the end that is attached to the die is in contact with a stiffener of the CB. Heat produced by the die is dissipated through the HTC device and into the stiffener, which functions as a mechanical stabilizer. The stiffener may also function as a heat sink material. In some embodiments, a separate heat sink material may be used in addition to the stiffener, in which case, the heat that is dissipated into the stiffener is then dissipated into the heat sink material.

Figure 1:
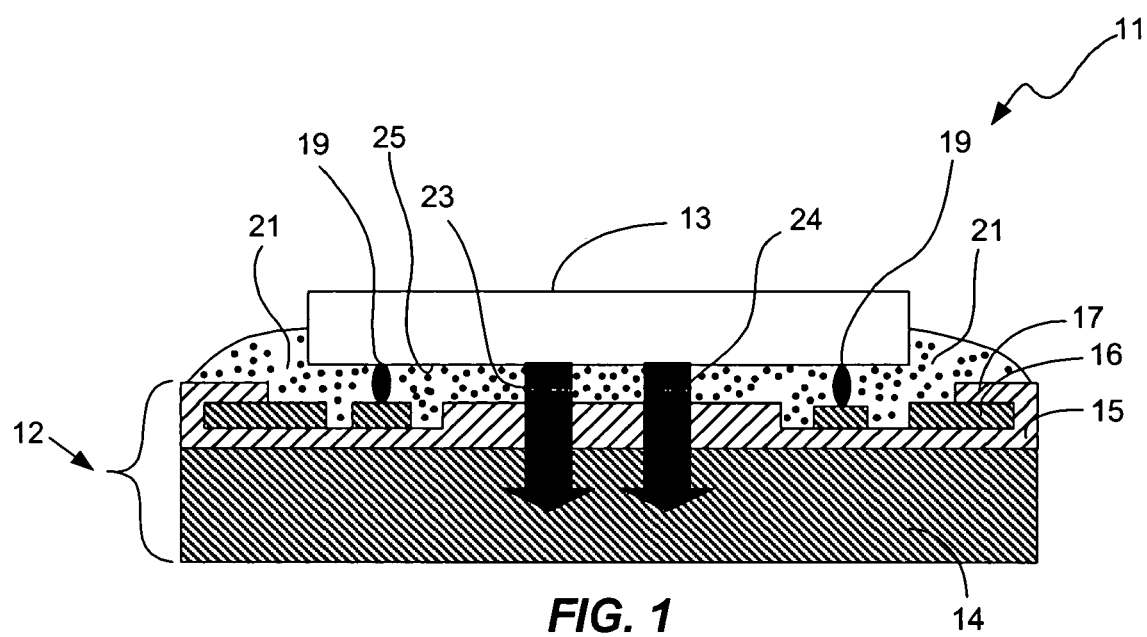
FIG. 1 illustrates a cross-sectional view of a typical direct-chip-attach configuration comprising a CB and an IC die mounted on the CB.

With reference again to the direct-chip-attach assembly 11 shown in FIG. 1, when the solder or lead-free bumps that form the interconnects 19 cool and harden, they do not always form interconnects of even sizes. This results in an uneven spacing between the bottom surface 25 of the die 13 and the traces formed in the metal layer 16. When this happens, the plane of the die 13 is not parallel to the plane of the CB 12, i.e., the die 13 "tilts" with respect to the CB 12. This tilt causes a mechanical stress to be placed on the die 13 that can cause the interconnects 19 to crack, which can prevent the die 13 from operating properly.

Figure 2:
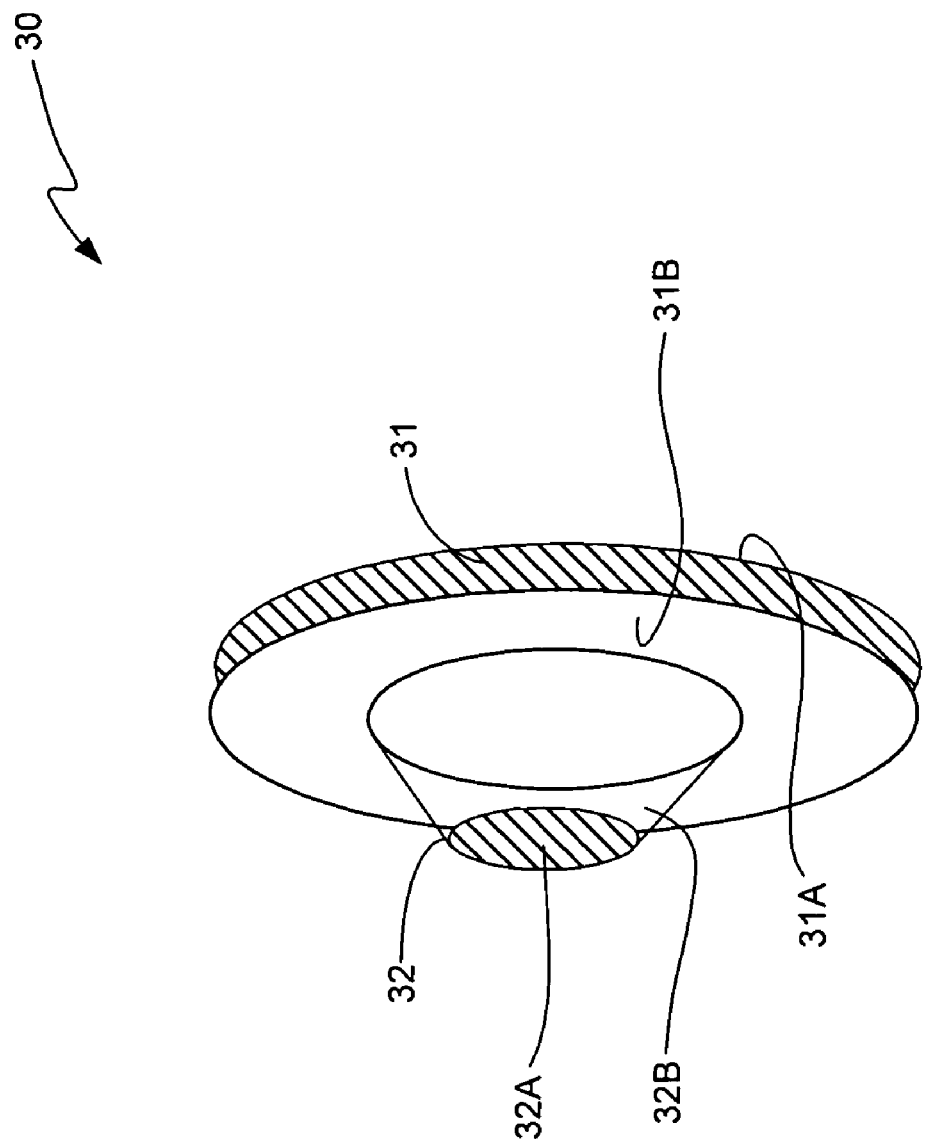
FIG. 2 illustrates a perspective view of the high thermal conductivity (HTC) device in accordance with an exemplary embodiment.

The HTC device of the invention not only provides improved heat dissipation, but also eliminates problems associated with tilt. FIG. 2 illustrates a perspective view of one embodiment of an HTC device 30 in accordance with the invention. In accordance with the illustrated embodiment, the HTC device 30 comprises a disk-shaped portion 31 and a cone-shaped portion 32. The disk-shaped portion 31 includes a first side 31A and a second side 31B. The cone-shaped portion 32 includes an end 32A and an outer surface 32B. End 32A of the cone-shaped portion 32 forms one end of the HTC device 30, and the first side 31A of the disk-shaped portion 31 forms the other end of the HTC device 30. As will be described in more detail with reference to FIG. 3, when the die is mounted to the CB, first side 31A is in contact with the side of the die facing the CB and end 32A is in contact with the CB, and in some embodiments, a stiffener associated with the CB. Thus, heat produced by the die is dissipated down through the HTC device 30 into the CB (e.g., the stiffener of the CB).

Figure 3:
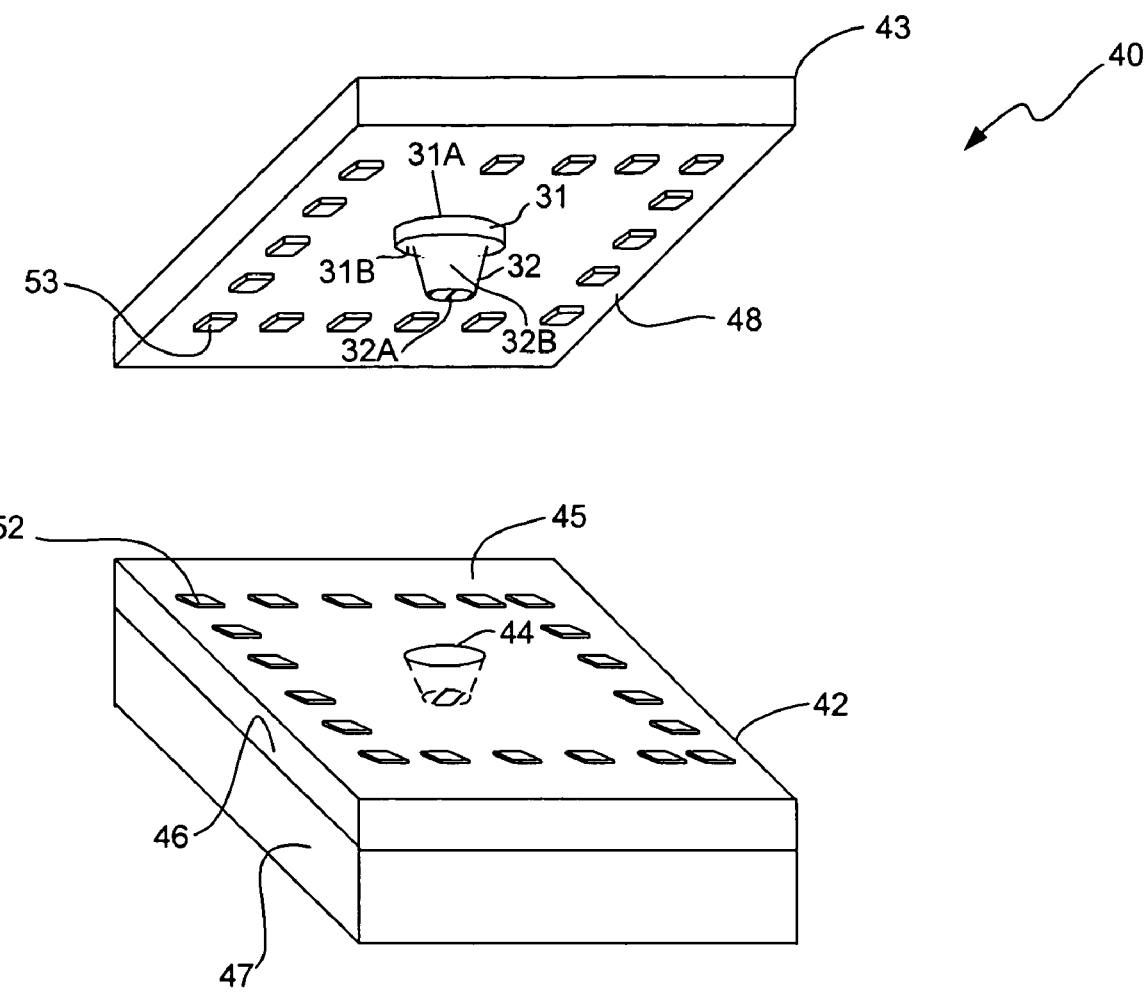
FIG. 3 illustrates a perspective view of the direct-chip-attach assembly of the invention in accordance with an exemplary embodiment having the HTC device shown in FIG. 2 attached to the die of the assembly.

FIG. 3 illustrates a perspective view of one embodiment of a direct-chip-attach assembly 40 in accordance with the present invention. The assembly 40 comprises the HTC device 30 shown in FIG. 2, a CB 42 and a die 43. In some embodiments, the CB 42 is a flex circuit. The CB 42 and the die 43 may be made up of the same layers as described above with reference to the CB 12 and die 13, respectively, shown in FIG. 1. However, it will be understood by those skilled in the art that the assembly 40 is not limited to any particular die or CB. In addition, it will also be understood by those skilled in the art that although the invention is being described with reference to a direct-chip-attach configuration, the invention is equally applicable to any type of die and CB combination, including, for example, multi-level CB and die attachment assemblies.

As shown in FIG. 3, the CB 42 can include a void 44 formed in it that extends through a top layer 45 of the CB 42, which comprises, for example, polyimide, down to an upper surface 46 of a stiffener 47, which comprises, for example, aluminum. First side 31A of the HTC device 30 may be attached to the bottom surface 48 of the die 43 in a variety of ways, such as by using a pressure adhesive (not shown). In one embodiment, when the die 43 is mounted on the CB 42, the HTC device 30 is positioned within the void 44, so that the end 32A of the HTC device 30 is in contact with the upper surface 46 of the stiffener 47. In some embodiments, end 32A of the HTC device 30 can be attached to the upper surface 46 of the stiffener 47 using, for example, a pressure adhesive or any other attachment material or technique. In other embodiments, end 32A of the HTC device 30 may be held against or near the upper surface 46 of the stiffener 47 merely by the pressure of the die 43 against the CB 42.

In the illustrated embodiment, the opening 44 is cone-shaped to accommodate the shape of the cone-shaped portion 32 of the HTC device 30. In accordance with this aspect of this embodiment, the void 44 is dimensioned such that the outer surface 32B of the cone-shaped portion 32 of the HTC device 30 is in contact with or close proximity to an inner wall of the void 44. As one skilled in the art will appreciate, the CB 42 and the die 43 include electrical connections 52 and 53, respectively, that are in contact with each other when the die 43 is mounted on the CB 42. In accordance with one embodiment, the overall length of the HTC device 30 from the first side 31A to end 32A is such that when the die 43 is mounted on the CB 42, the electrical connections 52 on CB 42 are in contact with respective electrical connections 53 on die 43 and the end 32A of the HTC device 30 is in contact with or in proximity to the upper surface 46 of the stiffener 47. In accordance with other embodiments, it is not necessary for the end 32A of the HTC device 30 to come into contact with the stiffener 47. For example, the void 44 may be partially filled with some material of high thermal conductivity such that when the die 43 is mounted to the CB 42, the end 32A of the HTC device 30 comes into contact with that material. In this example, the entire path from the die 43 to the stiffener 47 has a high thermal conductivity.

In accordance with embodiments of the present invention, heat produced by the die 43 will be dissipated from the die 43 through the HTC device 30 and into the stiffener 47. In addition, dimensioning of the HTC device 30 is such that when the die 43 is mounted on the CB 42, connections 52 and 53 are in contact with each other, and the end 32A of the HTC device 30 is in contact with or in proximity to the upper surface 46 of the stiffener 47. This configuration helps eliminate the potential for the die 43 to tilt with respect to the CB 42. For example, in the case where the connections 53 are solder bumps, even if all of the bumps do not harden to the same height, or if one or more bumps collapse, the contact between the end 32A and the upper surface 46 of the stiffener 47 will help prevent the die 43 from tilting. In addition, the complimentary shapes of the void 44 and the HTC device 30 render the HTC device 30 and the void 44 self-aligning, which also can facilitate mounting of the die 43 on the CB 42.

The HTC device 30 can be placed on the die 43 during the die fabrication process by a variety of techniques, such as, for example, extrusion or injection molding. The HTC device 30 may be made of any material that has a higher thermal conductivity than that of the layer 45 of the CB 42. Some suitable materials include, but are not limited to, thermally conductive elastomers or thermoplastics. The HTC device 30 may be placed on the die 43 after all of the other layers of the die have been formed including the passivation layer. If the HTC device 30 is placed on the die at the wafer level, a mold containing many, (e.g., thousands) molds for many HTC devices may be used to place HTC devices on many respective dies. Then, when the dies are cut from the wafer, each die will have an HTC device attached thereto. Alternatively, the HTC devices 30 may be placed on the dies after they have been cut from the wafer.

The HTC device of the invention is not limited to being made of any particular high thermal conductivity material. For example, the HTC device may be a solder bump that is put on the die when the solder bumps that form the connections 53 are placed on the die 43. In this case, forming the HTC device does not require that an additional process step be performed when making either the die 43 or the CB 42. A material of high thermal conductivity may be disposed in the void such that when the die 43 is mounted to the CB 42, the solder bump that comprises the HTC device comes into contact with the material. This ensures that the entire path from the die to the stiffener is of high thermal conductivity. This also makes it unnecessary for the solder bump comprising the HTC device to be made large enough to extend from the die to the stiffener.

It should be noted that the invention has been described with reference to a few example embodiments and that the present invention is not limited to these embodiments. The embodiments described herein are meant to convey the principles and concepts of the present invention and are not intended to demonstrate exclusive embodiments for carrying out the invention. For example, the HTC device has been described as having a conical shape. This is only one of many possible shapes for the HTC device. The HTC device is not limited to having any particular shape or to being made of any particular material. Also, although the HTC device has been described as being attached first to the die, it may instead be attached first to the CB. Further, in other embodiments, more than one HTC device can be used. For example, multiple HTC devices can be positioned between die 43 and CB 42. Other modifications may be made to the embodiments described herein and all such modifications are within the scope of the present invention.

What is claimed is:

1. A circuit board (CB) assembly comprising:
   a CB including one or more electrical connections, and a substantially conical shaped void formed therein;
   an integrated circuit (IC) die mounted to a side of the CB, the die including one or more electrical circuits and one or more electrical connections, at least one of the electrical connections on the CB being in contact with at least one of the electrical connections on the die; and a high thermal conductivity (HTC) device comprising a substantially conical shape that is complimentary relative to the substantially conical shaped void, the HTC device having a first end and a second end, the HTC device being at least partially disposed in the void, such that the first end of the HTC device is thermally coupled to the die, and the second end of the HTC device is thermally coupled to a portion of the CB below the void, the HTC device and void provide a self-alignment feature for the die relative to the CB.

2. The CB assembly of claim 1, wherein the die is mounted to the CB in a direct-chip-attach configuration.

3. The CB assembly of claim 1, wherein the CB is a single-layer CB.

4. The CB assembly of claim 1, wherein the CB comprises:
a first layer comprising a first side and a second side, wherein the die is attached adjacent to the first side of the first layer; and
a stiffener layer disposed adjacent to the second side of the first layer; wherein the void extends through at least the first layer down to the stiffener layer, the second end of the HTC device being in contact with the stiffener layer, and wherein the stiffener layer comprises a high thermal conductivity material.

5. The CB of claim 1, wherein the HTC devices comprises a thermally conductive elastomer.

6. The CB of claim 1, wherein the HTC device comprises a thermoplastic.

7. The CB of claim 1, wherein the HTC device comprises a metal.

8. The CB of claim 7, wherein the metal is solder.

9. A circuit board (CB) assembly comprising:
a CB including one or more electrical connections, and a substantially conical shaped void formed therein;
an integrated circuit (IC) die mounted to a side of the CB, the die including one or more electrical circuits and one or more electrical connections, at least one of the electrical connections on the CB being in contact with at least one of the electrical connections on the die; and
a high thermal conductivity (HTC) device comprising a substantially conical shape that is complimentary relative to the substantially conical shaped void, the HTC device having a first end and a second end, the HTC device being at least partially disposed in the void, such that the first end of the HTC device is attached to the die, and the second end of the HTC device is attached to or is in close proximity with a portion of the CB below the void, the HTC device and void provide a self-alignment feature for the die relative to the CB.

10. A circuit board (CB) assembly comprising:
a CB including one or more electrical connections, and a substantially conical shaped void formed therein;
an integrated circuit (IC) die mounted to a side of the CB, the die including one or more electrical circuits and one or more electrical connections, at least one of the electrical connections on the CB being in contact with at least one of the electrical connections on the die; and
a high thermal conductivity (HTC) material comprising a substantially conical shape that is complimentary relative to the substantially conical shaped void, the HTC material being at least partially disposed in the void, such that the HTC material is thermally coupled to the die, and the HTC material is thermally coupled to a portion of the CB below the void, the HTC material and void provide a self-alignment feature for the die relative to the CB.

11. The circuit board (CB) assembly of claim 10, wherein the high thermal conductivity (HTC) material includes an HTC device having a first end and a second end.

12. The circuit board (CB) assembly of claim 11, wherein the first end of the HTC device is thermally coupled to the die and the second end of the HTC device is thermally coupled to a portion of the CB below the void.

13. The circuit board (CB) assembly of claim 10, wherein the high thermal conductivity (HTC) material comprises a material having a thermal conductivity which is higher than a thermal conductivity of the circuit board.

14. The circuit board (CB) assembly of claim 10, wherein the high thermal conductivity (HTC) material comprises one of a thermally conductive elastomer, a thermoplastic, and a metal.

* * * * *